(12) United States Patent
Zhang et al.

(10) Patent No.: US 8,944,851 B2
(45) Date of Patent: Feb. 3, 2015

(54) FIXING MEMBER FOR RISER CARD

(71) Applicant: ScienBiziP Consulting (Shen Zhen) Co., Ltd., Shenzhen (CN)

(72) Inventors: De-Guang Zhang, Shenzhen (CN); Chao-Rong Lai, Shenzhen (CN)

(73) Assignee: ScienBiziP Consulting (Shen Zhen) Co., Ltd., Guangdong (CN)

( * ) Notice: Subject to any disclaimer, the term of this patent is extended or adjusted under 35 U.S.C. 154(b) by 0 days.

(21) Appl. No.: 13/727,557

(22) Filed: Dec. 26, 2012

(65) Prior Publication Data

US 2014/0179168 A1 Jun. 26, 2014

(30) Foreign Application Priority Data

Dec. 21, 2012 (CN) .......................... 2012 1 0561181

(51) Int. Cl.
*H01R 24/00* (2011.01)
*H01R 12/72* (2011.01)
*H01R 13/64* (2006.01)
*H05K 7/00* (2006.01)

(52) U.S. Cl.
CPC .............. *H01R 12/721* (2013.01); *H01R 13/64* (2013.01); *H05K 7/00* (2013.01)

USPC .......................................................... 439/630

(58) Field of Classification Search
USPC ......... 439/630, 579, 578, 585, 583, 394–395, 439/877

See application file for complete search history.

(56) References Cited

U.S. PATENT DOCUMENTS

| | | | |
|---|---|---|---|
| 6,639,806 B1 * | 10/2003 | Chuang et al. ................. | 361/748 |
| 8,238,097 B2 * | 8/2012 | Chen et al. ............... | 361/679.58 |
| 8,432,684 B2 * | 4/2013 | Wu et al. .................. | 361/679.43 |
| 8,559,189 B2 * | 10/2013 | Li ................................ | 361/803 |
| 2008/0055876 A1 * | 3/2008 | Fan et al. ....................... | 361/801 |
| 2008/0106862 A1 * | 5/2008 | Liang ............................ | 361/686 |
| 2013/0166806 A1 * | 6/2013 | Wu et al. ....................... | 710/301 |

* cited by examiner

*Primary Examiner* — Jean F Duverne
(74) *Attorney, Agent, or Firm* — Novak Druce Connolly Bove + Quigg LLP

(57) ABSTRACT

A fixing member for fixing a riser card with an edge connector includes a board for fixing the riser card, and a blocking piece connected to a bottom side of the board and adjacent to the edge connector. The blocking piece is arranged to abut a top of an expansion slot longer than the edge connector, to prevent the edge connector from being inserted into the expansion slot.

2 Claims, 3 Drawing Sheets

FIXING MEMBER FOR RISER CARD

BACKGROUND

1. Technical Field

The present disclosure relates to a fixing member for fixing a riser card.

2. Description of Related Art

If a riser card is inserted into an expansion slot longer than the edge connector of the riser card, an open circuit may result.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
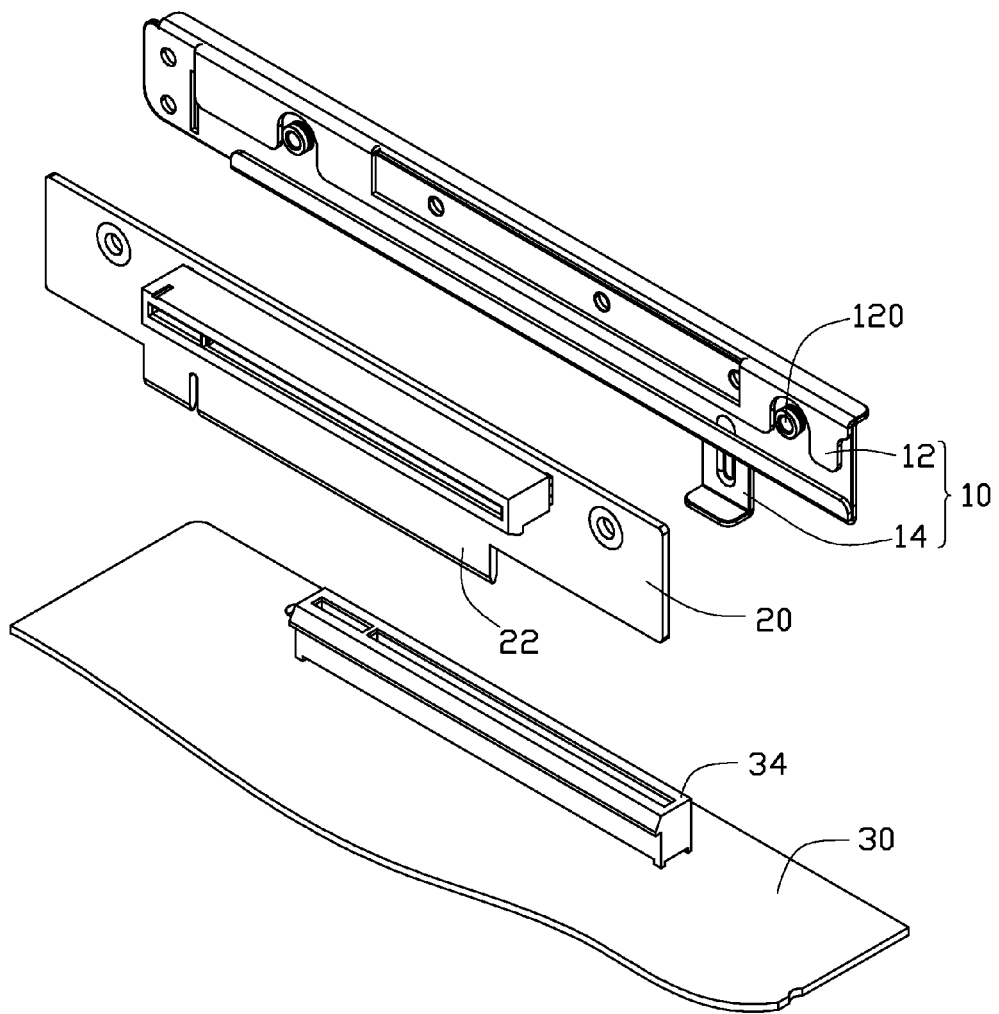
FIG. 1 is an exploded, isometric view of an exemplary embodiment of a fixing member, together with a riser card.
Figure 3:
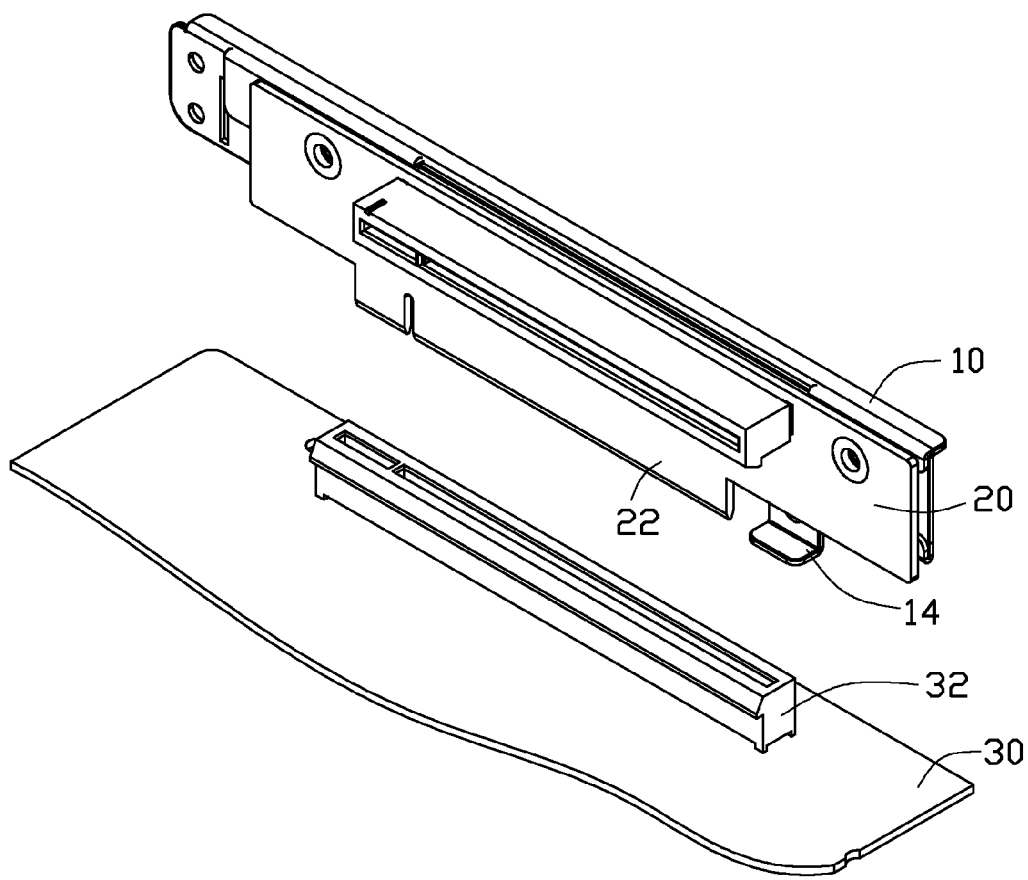
FIG. 3 shows another using state of the fixing member and the riser card.

Referring to FIGS. 1 and 3, an exemplary embodiment of a fixing member 10 is provided for fixing a riser card 20 which includes an edge connector 22 at a bottom side into an expansion slot of the correct size. The fixing member 10 is provided for preventing the edge connector 22 from being inserted into an expansion slot 32 longer than the edge connector 22. The expansion slot 32 is mounted on a motherboard 30.

The fixing member 10 includes a fixing arm (not shown) to be mounted to a chassis (not shown) containing the motherboard 30, a board 12 connected to the fixing arm, and an L-shaped blocking piece 14 extending down from a bottom side of the board 12 and then is perpendicularly extended outward. The board 12 defines two fixing holes 120.

Two screws (not shown) extend through the riser card 20 and then are respectively engaged in the fixing holes 120, thereby fixing the riser card 20 to the board 12. The blocking piece 14 is adjacent to an end of the edge connector 22.

Figure 2:
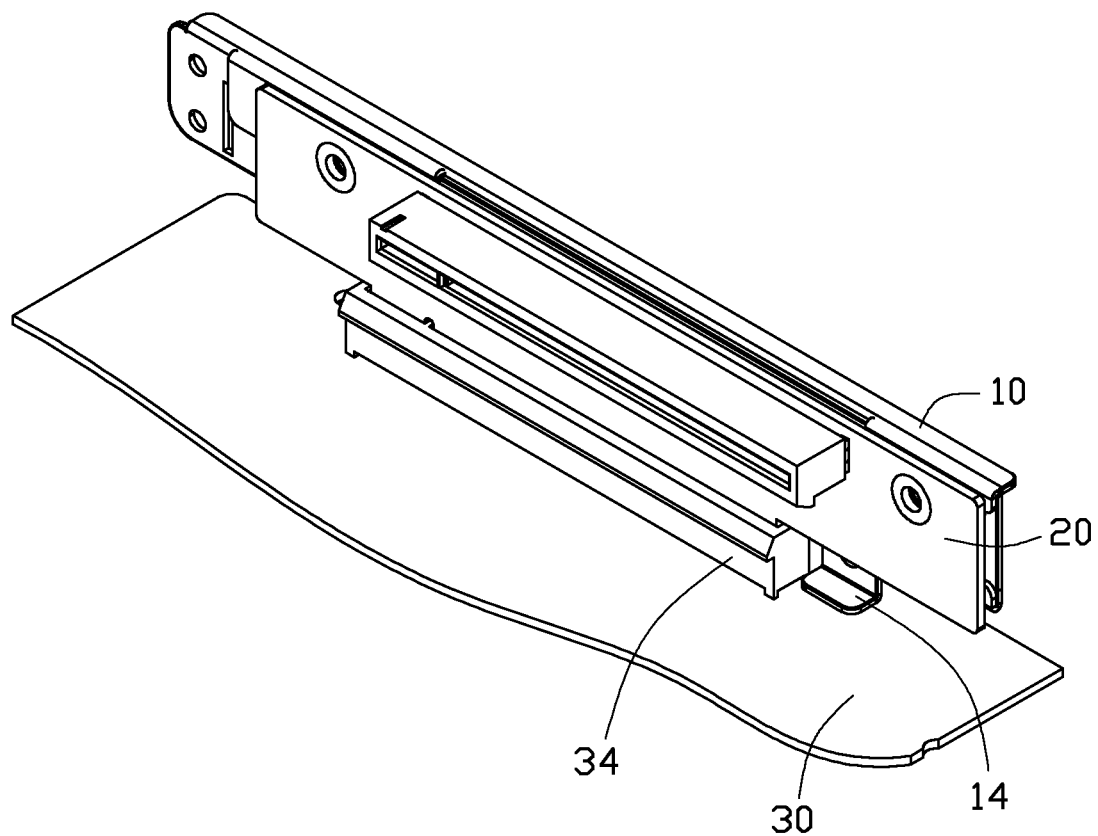
FIG. 2 is an assembled, isometric view of FIG. 1.

Referring to FIGS. 2 and 3, when the riser card 20 is inserted into a proper expansion slot 34 whose length is suitable for the edge connector 22, the edge connector 22 is completely inserted into the expansion slot 34, and the blocking piece 14 abuts on the motherboard 30 adjacent to an end of the expansion slot 34. In other words, the blocking piece 14 is spaced from the edge connector 22 at a predetermined distance such that it will not interfere with the insertion of the edge connector 22 into the expansion slot 34 that matches the length of the edge connector 22. However, if an attempt is made to insert the riser card 20 into the expansion slot 32 which is longer than the edge connector 22, a bottom of the blocking piece 14 abuts a portion of a top of the expansion card 32 that is beyond the edge connector 22, thereby preventing the edge connector 22 from being inserted into the expansion slot 32, thereby protecting the edge connector 22.

It is believed that the present embodiments and their advantages will be understood from the foregoing description, and various changes may be made thereto without departing from the spirit and scope of the description or sacrificing all of their material advantages, the examples hereinbefore described merely being exemplary embodiments.

What is claimed is:

1. A fixing member for fixing a riser card with an edge connector, comprising:
    a board to which the riser card is mounted; and
    a blocking piece connected to a bottom side of the board and adjacent to an end of the edge connector, wherein the blocking piece is operable to abut a top of an expansion slot longer than the edge connector to prevent the edge connector from being inserted into the expansion slot; and
    wherein the blocking piece is spaced from the end of the edge connector at a predetermined distance such that the blocking piece does not interfere with insertion of the edge connector into an expansion slot that matches a length of the edge connector.

2. A fixing member for fixing a riser card with an edge connector, comprising:
    a board to which the riser card is mounted; and
    a blocking piece connected to a bottom side of the board and adjacent to an end of the edge connector, the blocking piece and the edge connector substantially arranged in a line along a lateral direction of the edge connector, wherein when the edge connector is moved toward an expansion slot longer than the edge connector, the blocking piece abuts a top of the expansion slot to prevent the edge connector from being inserted into the expansion slot.

* * * * *